United States Patent
Marcus et al.

(12) 
(10) Patent No.: US 6,245,444 B1
(45) Date of Patent: *Jun. 12, 2001

(54) MICROMACHINED ELEMENT AND METHOD OF FABRICATION THEREOF

(75) Inventors: Robert B. Marcus, Murray Hill, NJ (US); Yanwei Zhang, Plano, TX (US)

(73) Assignee: New Jersey Institute of Technology, Newark, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/942,623

(22) Filed: Oct. 2, 1997

(51) Int. Cl.⁷ .......................... G01R 31/28; G01R 1/067
(52) U.S. Cl. ..................... 428/616; 428/615; 428/617; 428/620; 428/212; 428/332; 267/156; 267/167
(58) Field of Search ........................... 428/616, 615, 428/617, 620, 212, 332; 267/156, 167; 438/54, 72, 128

(56) References Cited

U.S. PATENT DOCUMENTS

| | | |
|---|---|---|
| 4,038,599 | 7/1977 | Bove et al. . |
| 4,520,314 | 5/1985 | Asch et al. . |
| 4,563,640 | 1/1986 | Hasegawa . |
| 4,740,410 | 4/1988 | Muller et al. . |
| 4,757,255 | 7/1988 | Margozzi . |
| 4,787,752 | 11/1988 | Fraser et al. . |
| 4,799,009 | 1/1989 | Tada et al. . |
| 4,961,052 | 10/1990 | Tada et al. . |
| 4,983,907 | 1/1991 | Crowley . |
| 5,012,187 | 4/1991 | Littlebury . |
| 5,172,050 | 12/1992 | Swapp . |
| 5,334,931 | 8/1994 | Clarke et al. . |
| 5,406,211 | 4/1995 | Inoue et al. . |
| 5,415,555 | 5/1995 | Sobhani . |
| 5,434,513 | 7/1995 | Fujii et al. . |
| 5,440,241 | 8/1995 | King et al. . |
| 5,457,882 | 10/1995 | Clarke et al. . |
| 5,475,318 | 12/1995 | Marcus et al. . |
| 5,510,721 | 4/1996 | Walles et al. . |
| 5,517,515 | 5/1996 | Spall et al. . |
| 5,665,648 | * 9/1997 | Little . |
| 5,771,902 | * 6/1998 | Lee et al. . |
| 5,870,007 | * 2/1999 | Carr et al. . |

FOREIGN PATENT DOCUMENTS

| | | |
|---|---|---|
| 687907 | 12/1995 | (EP) . |
| WO 96/24145 | 8/1996 | (WO) . |
| WO 9624145 | 8/1996 | (WO) . |
| 96/28841 | * 9/1996 | (WO) . |
| WO 9641506 | 12/1996 | (WO) . |
| WO 9721105 | 6/1997 | (WO) . |

OTHER PUBLICATIONS

Lin et al., Design, Fabrication, and Testing of a C–Shape Actuator, 8th International Conference on Solid–State Sensors, p. 416–419, Jun. 29, 1995.*

Reithmuller et al., Thermally Excited Silicon Microactuators, IEEE Transactions on Electron Devices, Col. 35 No. 6, p. 758–763, Jun. 1988.*

* cited by examiner

Primary Examiner—Deborah Jones
Assistant Examiner—Jason Savage
(74) Attorney, Agent, or Firm—Klauber & Jackson

(57) ABSTRACT

A micromachined element mounted to a substrate, the element including a cantilever having a proximal portion attached to the substrate and a coilable distal portion terminating in a free distal end. The coilable distal portion, upon being heated, is capable of bending away from the substrate and at least partially coiling upon itself to form a coiled portion. At least part of the micromachined element may be electrically conductive. In various embodiments, the micromachined element may function as a mechanical microspring, an electrically conductive link, and/or a magnetic coil. A method of fabricating the microelement may include the steps of selectively depositing various layers upon the substrate.

24 Claims, 11 Drawing Sheets

50

MICROMACHINED ELEMENT AND METHOD OF FABRICATION THEREOF

BACKGROUND OF THE INVENTION

The present invention relates to micromachined systems and elements generally and, more particularly, but not by way of limitation, to microsensors, microactuators, microprobes, and probe cards and, more particularly, but not by way of limitation, to a novel micromachined coiled element and method of fabrication thereof.

DESCRIPTION OF THE RELATED ART

Various micromachined or microelectromechanical devices, such as sensors and actuators, on a microscopic scale have been developed.

For example, U.S. Pat. No. 5,434,513 issued to Fujii et al. discloses a semiconductor wafer testing apparatus capable of allowing numerous circuit elements of a semiconductor wafer to be tested at once. A plurality of pogo pins which have moveable connection pins inserted therein, are urged downward and are moveable in an axial direction, wherein the tips of the respective connection pins contact the pickup electrodes or control electrodes formed on the semiconductor wafer, with pressure, to provide electrical connections.

U.S. Pat. No. 5,172,050 issued to Swapp discloses a probe fixture for testing an integrated circuit, the probe fixture including a semiconductor substrate, a plurality of cavities etched into the substrate, a plurality of flexible beams formed from the substrate, wherein each beam extends over a portion of each of the cavities, a plurality of conductive probe tips, wherein each probe tip is formed on one of the beams, and a conductive interconnect formed on the substrate for coupling each probe tip to an external circuit tester. The electrode pads are forced into contact with the probe tips when the semiconductor probe card and integrated circuit are pressed firmly together.

U.S. Pat. No. 4,520,314 issued to Asch et al. discloses a test probe head for contacting and testing a plurality of exposed closely spaced electrically conductive members of very small dimensions, wherein the probe comprises a monolithic monocrystalline silicon comb-shaped structure having a spine portion and a plurality of elongated teeth which provide a plurality of miniature resilient cantilever beams.

U.S. Pat. No. 5,415,555 issued to Sobhani discloses an electrical interconnection apparatus which utilizes raised connecting means. A pair of electrical circuits, which may be both flexible, or one flexible and one rigid, are interconnected by projections, such as bumps or rings.

U.S. Pat. No. 5,012,187 issued to Littlebury teaches a method of testing integrated circuits using a tester which is capable of testing a plurality of memories in parallel. A membrane test head having a plurality of probe bumps is coupled to the tester.

U.S. Pat. No. 5,510,721 issued to Walles et al. discloses a test socket for testing an integrated circuit, wherein a substrate has a plurality of trenches that are traversed by a plurality of resilient conductive straps which extend across the trenches. The straps are deformed in a predetermined manner into the trenches while the straps are urged against the contacts.

Patent No. EP 687 907 issued to Hamasaki discloses a microeddy current sensor having a coil formed on a silicon substrate by a micromachining technique wherein the coil is formed by electrode deposition of a metal. The coil has a multilayered structure in the vertical direction and/or a core formed proximate the central position of the coil. A resist layer is formed on a silicon substrate through an insulating film by micromachining, and a spiral groove is two-dimensionally formed in the resist layer by patterning, whereafter a metal such as copper is buried in the groove by electrodeposition, thereby forming a coil, resulting in a microeddy current sensor which can detect a small change in magnetic field.

U.S. Pat. No. 4,740,410 issued to Muller et al. discloses a method, and the product resulting therefrom, for making a microminiature structure with two or more members which are relatively moveable to each other, such as a spring-restrained pin joint. A spiral spring extends through two and half revolutions and is made of two micrometer-wide second-layer polysilicon. The central end of the spring is connected to a hub, and the outer end is connected to a moveable arm. The horizontal spring structure is used in ratchet closures and brush-contact detents.

Patent No. WO 96/24145 issued to Ho discloses a micromachined micromagnetic actuator having a flap capable of large deflections using a magnetic actuating force. The flap is coupled by one or more beams to a substrate, and is cantilevered over the substrate. A magnetic layer or magnetic coil is disposed on the flap, wherein the flap is selectively rotated out of the plane of the substrate. The flap comprises different layers, and the intrinsic stresses of the different layers contribute to a bending moment which causes the flap to be curved, rather than flat, at rest. Thermal mismatch of different materials in the composite layers causes the flap to bend down. The motion of the flap is a result of both thermal and magnetic effects. The patent also discloses a method of fabricating the microelectromagnetic actuator, wherein the method comprises providing a substantially completed actuator on a sacrificial layer disposed on an underlying substrate, removing the sacrificial layer by etching away through at least one opening defined through the actuator to expose the underlying sacrificial layer, and drying the actuator while simultaneously actuating the actuator to maintain the released portions of the actuator out of contact with the underlying substrate until the drying is complete.

Many of the techniques used in silicon chip processing have been used to produce these devices. The techniques include photolithography, x-ray and beam lithography, layer deposition and etching techniques.

Wafer probe cards may incorporate an array of elements for device characterization. Various elements such as cantilevers and probes of various shapes, structures, compositions, and membrane probe card structures have been developed for testing of semiconductor chips.

U.S. Pat. No. 5,475,318 issued to Marcus et al. discloses a microprobe comprising a bimorph actuated microcantilever having a probe tip which projects from the microcantilever. Upon heating of the microcantilever, the probe tip comes into contact with a material to be investigated.

Wafer-stage testing of semiconductor chips is pervasive throughout the industry. As chips get larger and more complex, such testing becomes increasingly difficult to execute with existing probe/test technology. As chips get more complex, the various components become smaller, their numbers increase, and the number of I-O pads on a device increases. Testing becomes even more difficult where contact surfaces are non-planar, such as encountered with solder bumps, curved "smart skin" surfaces, or in multi-chip assemblies.

Known membrane probes consist of an arrangement of probe contact pads on a membrane which are made to contact the device pads by applying a small pressure, forcing the two together. Although membrane probe card technology might be used for probing and testing the next generation of chips and packages, various problems inherent with the membrane probe card exist, as related, for example, to the increasing size of the membrane required for larger chips (in order to reduce the effect of bowing), the inability of the membrane probe card to offer compliant contact with surfaces of varying height as with the components of a Multi-Chip-Module (MCM), and the overall difficulty of using a membrane technology compared with a technology based on a rigid surface, such as a surface based upon silicon.

Therefore, the need exists, and continues to grow, for contacting circuits on wafers having varying heights or nonuniform surfaces for purposes of testing and/or connection with, or interconnection between, circuit elements during operation.

Accordingly, it is an object of the present invention to provide a microprobe which has a built-in compliancy for contacting adjacent surfaces of varying heights. Such a feature is absent from existing membrane probe cards.

It is another object of the present invention to provide a microprobe which applies a force to a contact pad wherein the force increases superlinearly as pressure is increased. Such feature is missing from existing cantilever contacts.

It is a further object of the present invention to provide a microprobe such that the probe card nominal surface is preferably planar, not curved, thereby permitting larger structures to be probed as compared to structures which are testable by existing probe membrane cards.

It is yet another object of the present invention to incorporate a plurality of microprobes into an integrated probe card for wafer-stage probing or testing of device chips and for probing or testing of multi-chip assemblies.

It is another object of the present invention to provide a process for making such a microprobe.

It is still another object of the present invention to provide a probe card having a high pad density.

It is yet another object of the present invention to provide a probe card which can contact area arrays as well as perimeter arrays.

It is a further object of the present invention to provide a probe card having a high density of surface contacts.

SUMMARY OF THE INVENTION

These and other objects are achieved by means of the present invention which provides, in at least one embodiment, a micromachined element mounted to a substrate, wherein the micromachined element comprises a cantilever having a proximal portion attached to the substrate and a free distal end, wherein the cantilever, upon being heated, is capable of bending away from the substrate and at least partially coiling upon itself to define a distal coiled portion.

In another embodiment, the present invention relates to a micromachined element mounted to a substrate, wherein the micromachined element comprises a cantilever having a proximal portion attached to the substrate and a coilable distal portion terminating in a free distal end. The coilable distal portion, upon being heated, is capable of bending away from the substrate and at least partially coiling upon itself to form a coiled portion. Heat may be applied globally to the cantilever, or group of cantilevers, to form the coiled portion(s), or heat may be resistively generated within each cantilever to form the coiled portion.

The free distal end may follow an inward spiral path when heat is supplied to the cantilever. Preferably, the degree of bending in the cantilever increases in a distal direction. The radius of curvature of the coiled portion preferably decreases distally along the cantilever.

The cantilever is preferably permanently suspended over the substrate and is separated therefrom by a gap.

The cantilever may either reversibly or irreversibly coil upon itself, depending, for example, upon the material from which the microelement is constructed.

At least part of the cantilever may be electrically conductive.

Moreover, at least part of the coiled portion may be electrically conductive, whereby electrification of the conductive part of the coiled portion generates an electromagnetic field. Thus, the micromachined element may be capable of generating a magnetic field, e.g. a field having an axis generally parallel to the surface of the substrate from which the element extends.

The cantilever may be electrically insulated from the substrate.

Preferably, the coiled portion is capable of being resiliently compressed.

In a preferred embodiment, the cantilever is substantially comprised of a bimorph structure or bimorph material construction.

Thus, the cantilever may further comprises a first conducting layer having at least one portion disposed proximate the substrate and a second layer disposed over the inner first conducting layer.

The cantilever may further include a conductive lead attached to the first conducting layer.

In a particular embodiment, the cantilever may include a first conductive lead attached to the first conducting layer proximate the proximal portion and a second conductive lead attached to the first conducting layer proximate the free distal end, whereby the coiled portion is capable of being electrified, thereby generating a magnetic field.

The first layer has a greater coefficient of thermal expansion than the second layer. In a particular embodiment, the first layer is comprised of a metal.

The cantilever may be at least partially voluted. The cantilever may further include at least one volute. For example, the cantilever may include at least one outer volute and at least part of an inner volute. The outer volute may be spaced apart from the inner volute when the micromachined element is uncompressed. At least two adjacent the volutes may be capable of resiliently contacting one another when the micromachined element is compressively loaded.

Thus, the volutes may be spaced apart from each other when the element is uncompressed. The outer volute may compress before the inner volute when the micromachined element is compressively loaded.

By way of further example, the cantilever include a plurality of volutes.

In another aspect, the present invention relates to a method of fabricating a coilable microelement upon a substrate, the method comprising the following steps: depositing a sacrificial layer upon the substrate; depositing and patterning resist thereby defining at least one metal reception region; depositing a first layer of a first material on the at least one metal reception region; depositing a second layer of a second material on top of the first layer, wherein the first layer has a higher coefficient of thermal expansion than the second layer; removing the resist; removing the sacrificial layer, thereby freeing at least one cantilever; and heating the at least one freed cantilever, thereby causing the at least one freed cantilever to at least partially curl upon itself. An underlying insulating layer may first be deposited upon the substrate. Further, a metal ground plane may be deposited upon the sacrificial layer before depositing and patterning the resist, wherein the first layer is electrodeposited atop the metal ground plane.

The method may further comprise attaching at least one heater to at least one of the freed cantilevers. Alternatively, or in addition, the microelement may be globally heated to cause the at least one freed cantilever to at least partially curl upon itself.

In another embodiment, a method of fabricating a coiled microelement upon a substrate, according to the present invention, comprises the following steps: depositing an insulating layer upon the substrate; depositing a sacrificial layer upon the insulating layer; patterning the sacrificial layer, thereby forming at least one remaining strip of sacrificial layer; depositing a metal ground plane upon at least a portion of the exposed insulating layer; depositing and patterning resist thereby defining at least one metal reception region to expose at least a portion of the ground plane; electrodepositing a first layer of metal on the at least one metal reception region and the resist; depositing a layer of a second material on top of the first layer wherein the first layer has a higher coefficient of thermal expansion than the second layer; removing the resist such that the second layer is patterned by lift-off; removing the remaining sacrificial layer so as to free at least one cantilever; and heating the freed cantilever, thereby causing the freed cantilever to at least partially curl upon itself.

The substrate may be comprised of silicon. The insulating layer may be comprised of an oxide.

The method may further include the subsequent step of electroplating the exposed surface of the first layer with a conductive material.

The cantilever may be individually or globally heated, or both.

BRIEF DESCRIPTION OF THE DRAWINGS

Understanding of the present invention and the various aspects thereof will be facilitated by reference to the accompanying drawing figures, submitted for purposes of illustration only and not intended to limit the scope of the invention, in which:

FIG. 5 shows the microspring under a slight applied force;

FIG. 6 shows the microspring under an applied force which is stronger than that of FIG. 5;

FIG. 7 shows an even stronger force applied to the microspring than in FIGS. 5 and 6;

FIG. 18 is a side elevational cut-away view of a microspring or microcoil precursor;

FIG. 19 is a side elevational cut-away view of a microspring or microcoil formed from the precursor of FIG. 18;

FIG. 20 is a side elevational cut-away representation of the microcoil or microspring of FIG. 19 wherein the outer or exposed surface of the inner layer of the bimorph structure is plated;

DETAILED DESCRIPTION OF PREFERRED EMBODIMENTS

Figure 1:
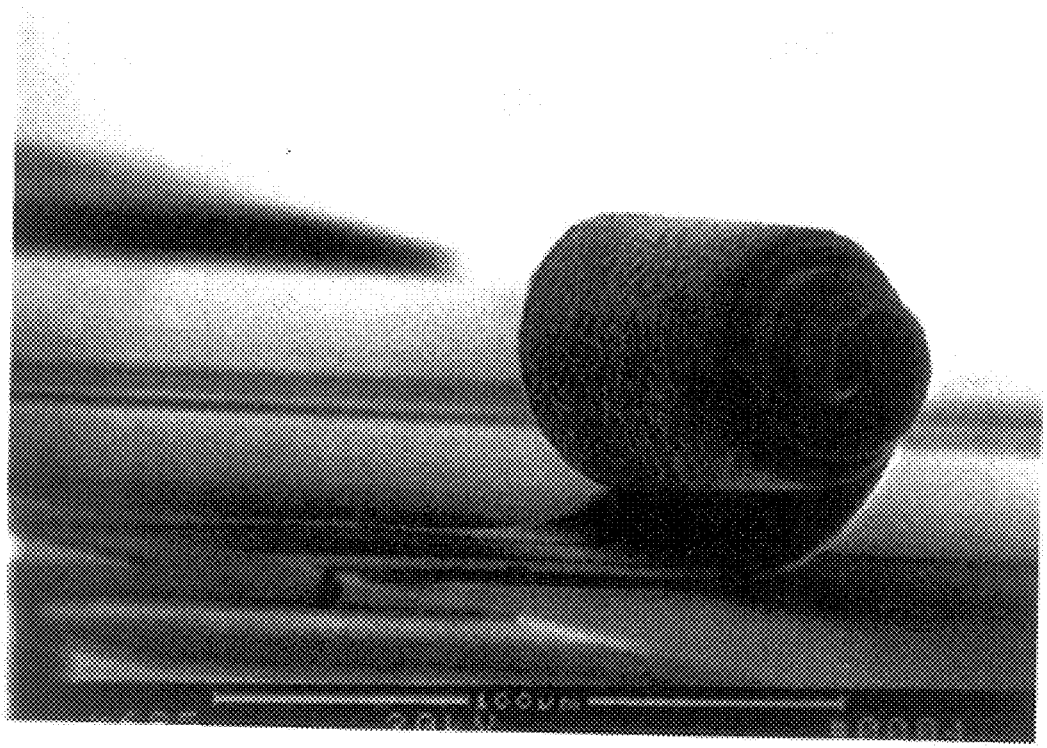
FIG. 1 is a scanning electron microscope (SEM) photograph showing the basic structure of one embodiment of a micromachined element according to the present invention.

FIG. 1 is a scanning electron microscope (SEM) photograph showing the basic structure of one embodiment of a micromachined element which can serve as a microprobe, according to the present invention. FIG. 1 shows a microelement or a microspring made of 40 $\mu$m-wide thin film slab consisting of metal and oxide layers at a magnification of 500×. The microelement shown may be characterized as a coil or a spring which is made from a cantilever member. Thus, each microprobe may be a microspring or microcoil. The proximal end of the microcoil projects outwardly from a base area and is preferably curled upon itself such that the distal end of the microcoil is surrounded by at least part of a volute, or a convolution, or turn of the microcoil.

As further explained below, the application of heat in form of electric resistance heating caused by a current passed through a cantilever made of substrate material, or by proper application of global heating such as furnace heating causes the cantilever to bend and coil upon itself. Preferably, the curling effect is irreversibly manifested by inducing a temperature high enough to plastically deform the cantilever.

On the other hand, the curling may be effected elastically or reversibly. For example if each cantilever is individually heated for example by resistive heaters, a microspring probe card according to the present invention can be heated to curl one or more microsprings, can make temporary contact with a device to be tested, then removed, after which heating power to the microsprings is terminated, causing the spring (s) to flatten back into a cantilever orientation. That is, a generic array of cantilevers could be made, and individual levers actuated to form microsprings wherever needed to provide contact.

Thus, an area contact array can be contacted by a probe card containing a plurality of microcoils which serve as contacts with the contact pads that are situated on the array.

Preferably, each coil contact on a microprobe card comprises a plurality of coils made from stiff, elastic conductor material.

Figure 2:
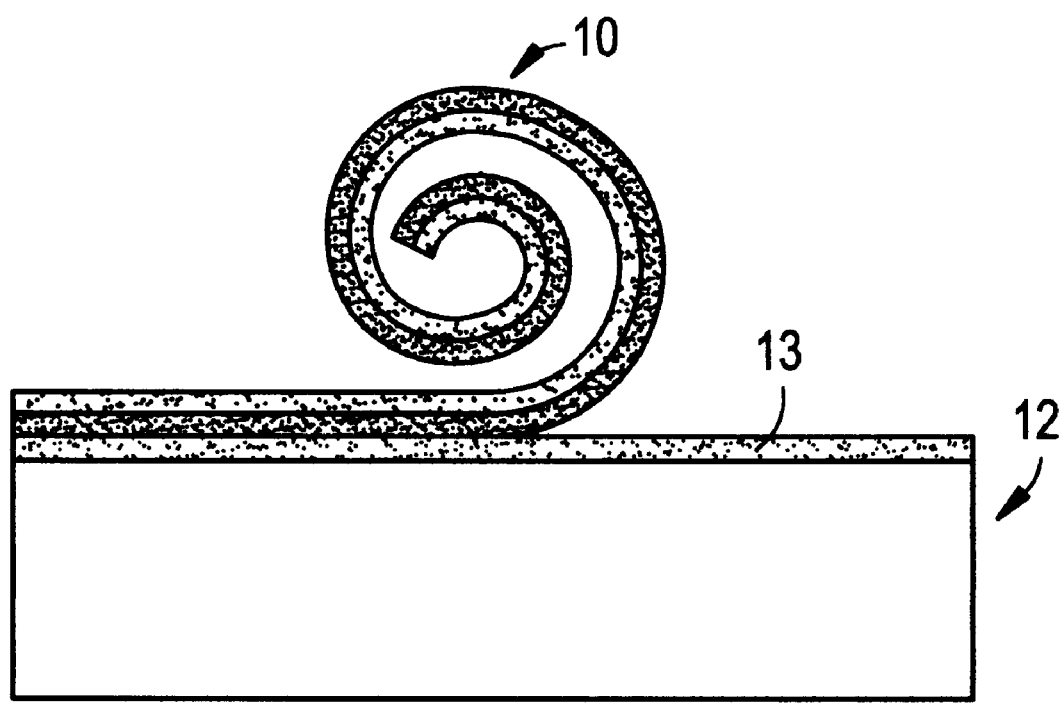
FIG. 2 schematically illustrates a side elevational cut-away view of a microspring according to the present invention.

FIG. 2 schematically illustrates a microspring or microcoil 10 according to the present invention with one part fixed to a surface of the substrate 12 of the probe card, which may be a silicon wafer. The microspring 10 is electrically isolated from the substrate by a thin insulating film 13. The fixed part would typically be electrically connected with broad pads at the edge of the probe card by IC technology known by those skilled in the art. The broad pads at the edge are configured to facilitate connections with standard plug contacts or connectors to external sources or devices.

Figure 3:
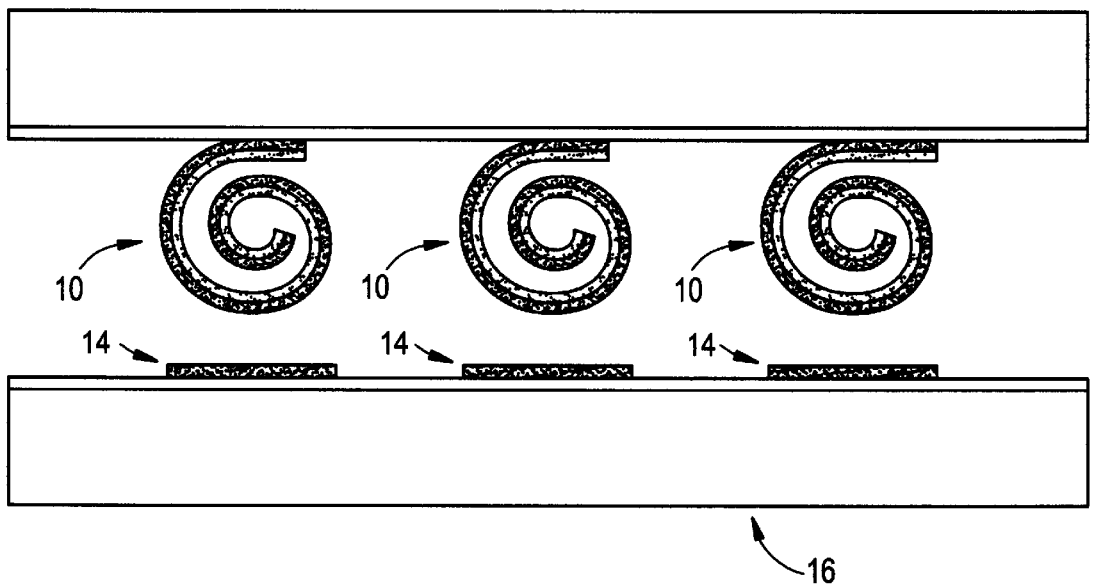
FIG. 3 illustrates a side elevational cut-away view of part of an array of microsprings on a probe card according to the present invention.

FIG. 3 schematically illustrates part of an array of microsprings 10 on a probe card ready to make ohmic contact with pads 14 on a device-under-test 16.

Figure 4:
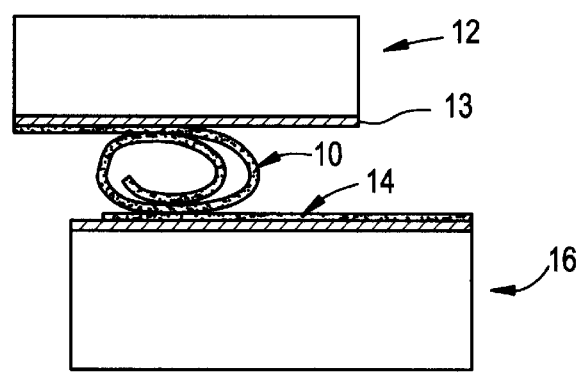
FIG. 4 schematically illustrates the compression of a microspring according to the present invention mounted on a substrate during ohmic contact with a contact pad of a device-under-test.

FIG. 4 schematically illustrates the compression of the microspring 10 mounted on its substrate 12 during ohmic contact with the contact pad 14 of a device-under-test 16. As the spacing between the wafer surface containing the microsprings 10 and the wafer surface of the device-under-test 16 containing the contact pads 14 decreases, the contact force increases superlinearly as additional spring elements or portions coming into play with increasing compression, as represented by FIGS. 5–7.

Figure 5:
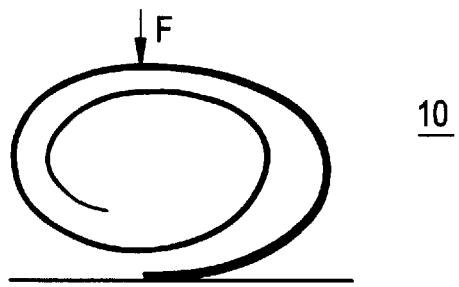
FIGS. 5-7 schematically illustrate successive compression of a microspring according to the present invention.

FIG. 5 represents a microspring 10 under slight compression, for example due to a slight applied force. The load is first taken up by the right side of the outermost coil as denoted by the heavy line between F and the substrate surface.

Figure 6:
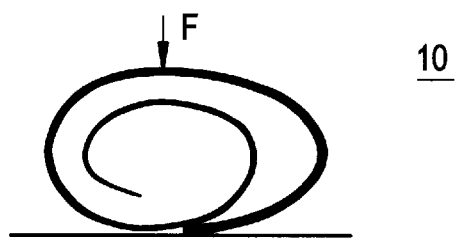

FIG. 6 represents the microspring under a stronger applied force, wherein the underside of the outermost coil contacts the substrate area, wherein the load is taken up by more of the microspring, for example the outermost volute.

Figure 7:
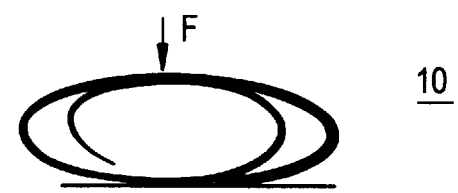

FIG. 7 represents the microspring under an even greater load which is taken up by a greater portion of the volutes.

Figure 8:
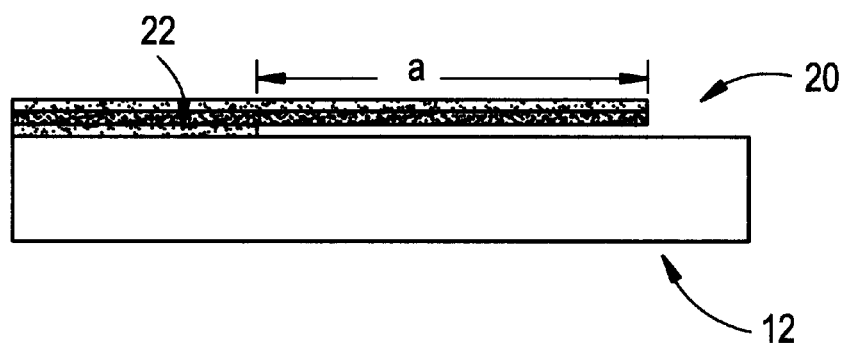
FIG. 8 is a side elevational view of a microspring or microcoil precursor according to the present invention.
Figure 9:
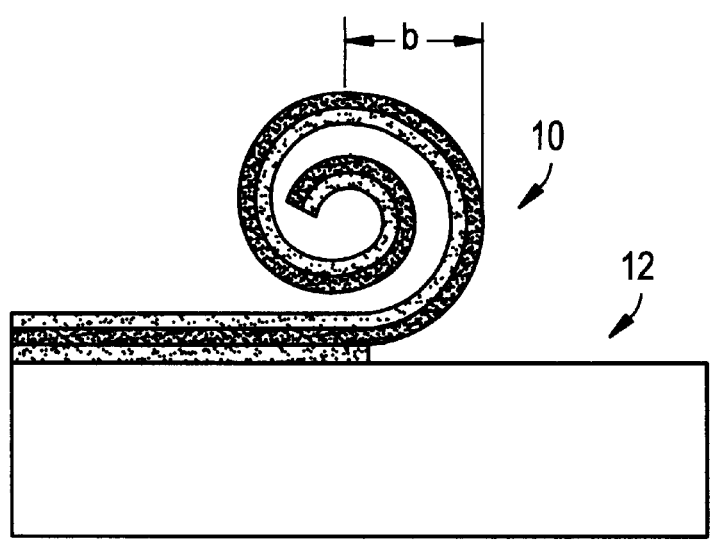
FIG. 9 is a side elevational view of a microspring or microcoil according to the present invention which results from the precursor of FIG. 8 after the application of heat.

FIGS. 8 and 9 show a side view of a microcoil precursor 20 and a resulting microcoil 10, respectively. In FIG. 8, the sacrificial layer 22 was removed to a distance "a" from its edge before heating. After heating, the fully formed coil 10 has a diameter "2b".

Figure 10:
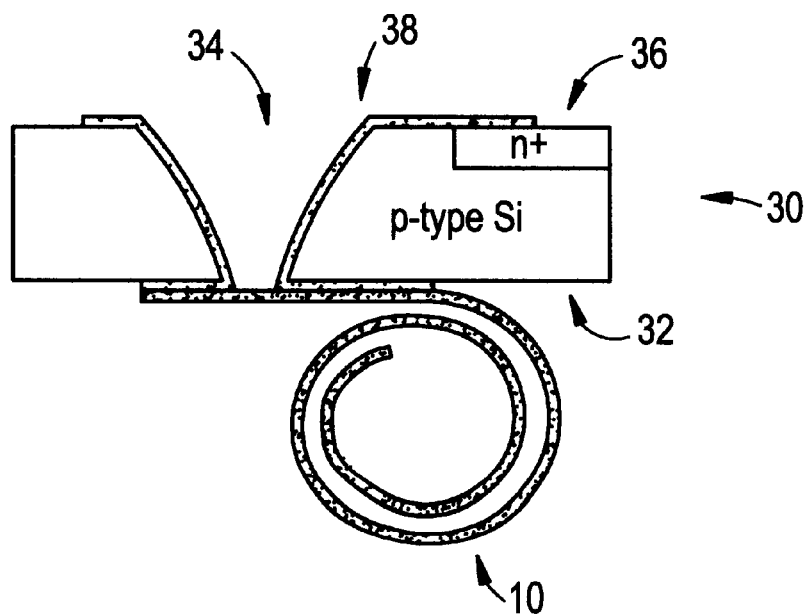
FIG. 10 illustrates a side elevational cut-away view of another embodiment of the present invention.

FIG. 10 schematically illustrates a cross-section of another embodiment of the present invention having a configuration which allows ohmic connection between microsprings on one side of a wafer and an integrated circuit on the other surface, which contains interconnects, passive and active thin film devices, through vias. This "backplane" can be used to supply temporary and/or permanent connections within a chip, or temporary and/or permanent connections among chips and other devices in a multi-chip assembly/module. Thus, the embodiment of FIG. 10 may be an "interconnection wafer" 30 having a microspring 10 on the second surface 32, electrical connection through a via 34 to the first surface 36, and electrical connections 38 to thin film interconnects and/or components on the first surface 36. In the particular embodiment shown in FIG. 10, the metal element labeled "p" on the first surface 36 and electrically connected to the microspring 10 on the second surface 32 is available for connection to the n+region MOS transistor or to any other device element or component on that surface.

Thus, FIG. 10 shows an alternate connection means comprising openings or vias 34 through the silicon layer to the back surface 36 of the wafer 30. As used herein, the term "via" refers to an opening in a layer provided to allow electrical contact from one surface to another through the opening.

Figure 11:
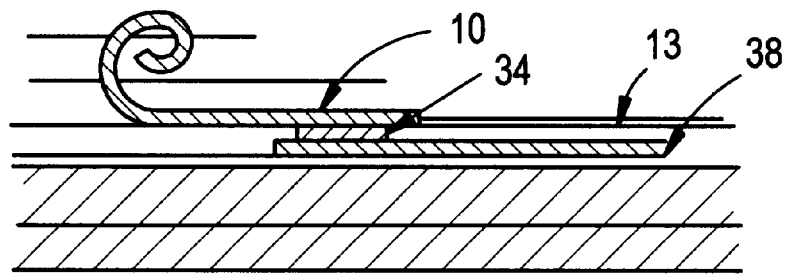
FIG. 11 shows a side elevational cut-away view of yet another embodiment of the present invention.

FIG. 11 shows yet another embodiment of the present invention wherein the interconnects 38 are disposed on the same surface as the microcoil or microspring 10.

As illustrated by the embodiment shown in FIG. 11, an electrical connection to each of the spring contacts 10 could be achieved through a lower level of metalization, where the metalization layer 38 and the microsprings 10 are separated by a thin insulating layer 13 and electrical connection is made through vias 34 in the insulating layer 13. A wafer 30 may contain microsprings 10 and its own interconnections, and possibly also some active devices, such as FETs, capacitors, etc., which can be made on the same side of the wafer as the microsprings 10, as shown in FIG. 11, or on the opposite side where more room is available, as shown in FIG. 10.

The cantilever element 20 from which the coil 10 is formed is preferably a bimorph. For example, as seen in FIG. 8, an oxide 22 is sandwiched between a silicon substrate 12 and the bimorph 20, wherein the oxide or sacrificial layer portion 22 has been removed in the area demarcated by "a". After heating, the bimorph 20 transforms into the microcoil 10, for example as shown in FIG. 9, resulting in a radius labeled "b". In this example, the linear space needed to form a spring of diameter "2b" is "a".

Figure 12:
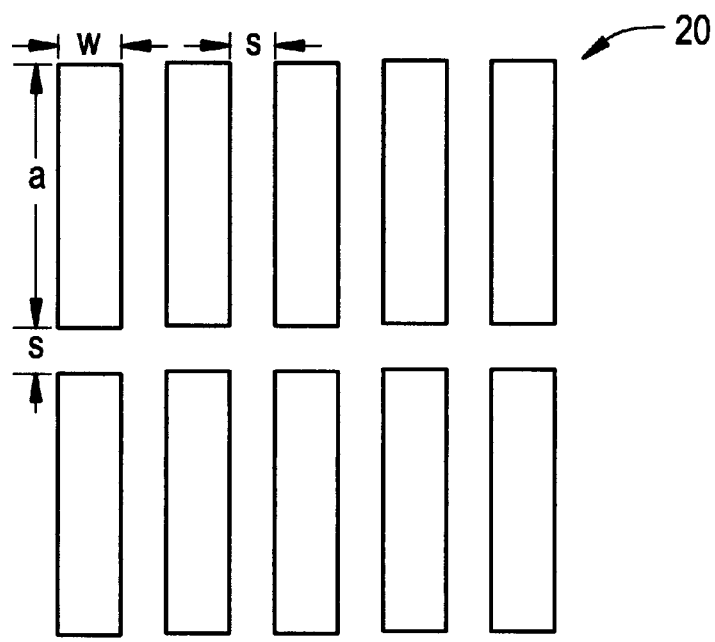
FIG. 12 schematically represents one embodiment of a layout of cantilevers which are precursors for microsprings according to the present invention.

FIG. 12 represents one embodiment of a layout of cantilevers 20 which are precursors for the microsprings. The cantilever length is "a" and the width is "w" and the spacing between cantilevers "s". The interconnections to the cantilevers are not shown.

Figure 13:
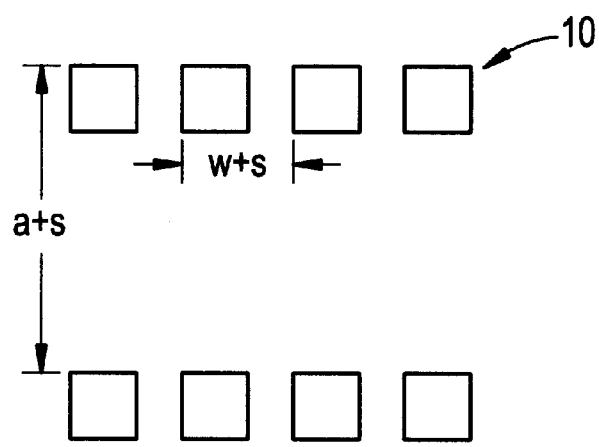
FIG. 13 shows the results of forming the precursors of FIG. 12 into microsprings or microcoils to provide an array according to the present invention.

FIG. 13 shows the results of forming the precursors 20 into microsprings 10 thereby providing an array of (a+s) by (w+s).

Most device chips made in the past have had contact pads arranged around the perimeter of the chip ("perimeter array"), and new device chips have pads located in the interior of the chip ("area array") or have a combination of interior and perimeter arrays.

As shown in FIGS. 12 and 13, an area array of cantilever members 20 has a length "a" longitudinally separated by distance "s" and has a width "w", wherein the cantilevers 20 are transversely separated by distance "s". After heating, the coils 10 are formed so as to provide contacts which are longitudinally separated by the distance "a+s" and transversely separated by the distance "w+s". Thus, the area array has an area or footprint of (a+s)*(w+s).

Thus, a probe card according to the present invention can yield a much higher density of surface contacts for an area array than previously known conventional probe cards. Conventional probe cards are limited because of the macroscopic size of the probes. By way of the above example, a rough estimate of the area density of the surface contacts of a probe card according to the present invention may be calculated by assuming that microsprings are formed from cantilevers 100 μm long and 30 μm wide, and are laid out in a parallel array, and assuming 20 μm spacing all around, then the repeat distances are 120 μm (i.e. 100+20) times 50 μm (30+20). Therefore, in a one square centimeter area, the probe card according to the present invention can provide 83 times 200 units, or 16,600 microsprings.

Thus, the present invention enables a very large number (greater than 10,000 per $cm^2$) of electrical contacts to be made in a device chip or chip assembly, so that the chip or assembly may be functionally tested. The present invention facilitates wafer-stage testing of semiconductor chips, especially when contact surfaces are non-planar, such as found with solder bumps or curved "smart skin" surfaces. Each contact spring or microspring or microprobe has a built-in compliancy for contacting surfaces of varying height. Furthermore, the force applied to the contact pad increases super linearly as the distance is decreased. Moreover, a probe card made in accordance with the present invention may be made planar, not curved, thereby permitting larger structures to be probed for testing than is the case with conventional membrane probe cards.

Thus, the present invention may comprise microprobe contacts made of microsprings 10 less than approximately 50 μm diameter, optimized to make ohmic contact with a metal test pad on a test sample. In the formation of an ohmic contact, the initially rounded coiled spring is elastically deformed to an oval shape with increasing stiffness as the applied force increases. A microspring may be made of a combination of metal and oxide layers. An arrangement of the microsprings may be made on an insulated silicon surface to create a probe card for making contact with pads as small as 25 μm. The substrate may also contain the interconnections necessary to bring ohmic connections from each microspring to large connectors at the perimeter.

A probe card according to the present invention may be operated in air or vacuum. "Standard" probe cards may be used in a vacuum, but they are typically more bulky than membrane probe cards or the like. Membrane probe cards, however, typically rely on a pressure differential applied across the membrane, and so the nature of the contact mechanism used for membrane probe cards would preclude the use of a vacuum. The present invention may be used with "standard" or membrane probe cards and the like.

Thus, formation of the present invention comprises the actuation of individual bimorph cantilevers 20. By way of example, a cantilever 20 may be made from a bimorph of $Al/SiO_2$ or $W/SiO_2$ with gold contact pads.

Figure 14:
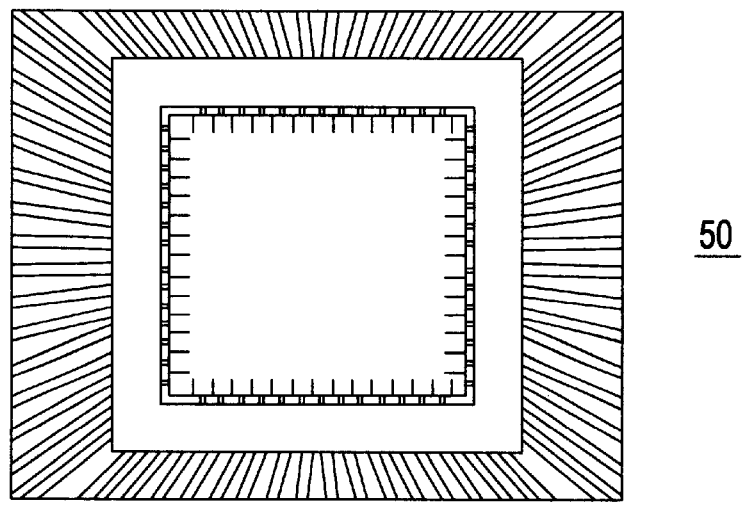
FIG. 14 is a plan view of a CHIPP probe card having cantilevers for contacting a perimeter array of pads on a chip, wherein the microsprings of the present invention would replace the cantilevers.

FIG. 14 shows a CHIPP probe card 50, mounted in a ceramic package, with cantilevers arranged in a fashion for contacting a perimeter array of pads on a chip. A probe card according to the present invention would include microsprings 10 in place of the cantilevers.

By way of example, one pair of bimorph material choices is the combination of tungsten (W) and copper (Cu). An optimum thickness ratio would be the thickness that yields the maximum cantilever deflection for a given set of parameters, such as cantilever geometry or ΔT. In order to determine the optimum thickness ratio of W and Cu, the deflection of a cantilever may be calculated with varying ratios of thicknesses.

Figure 15:
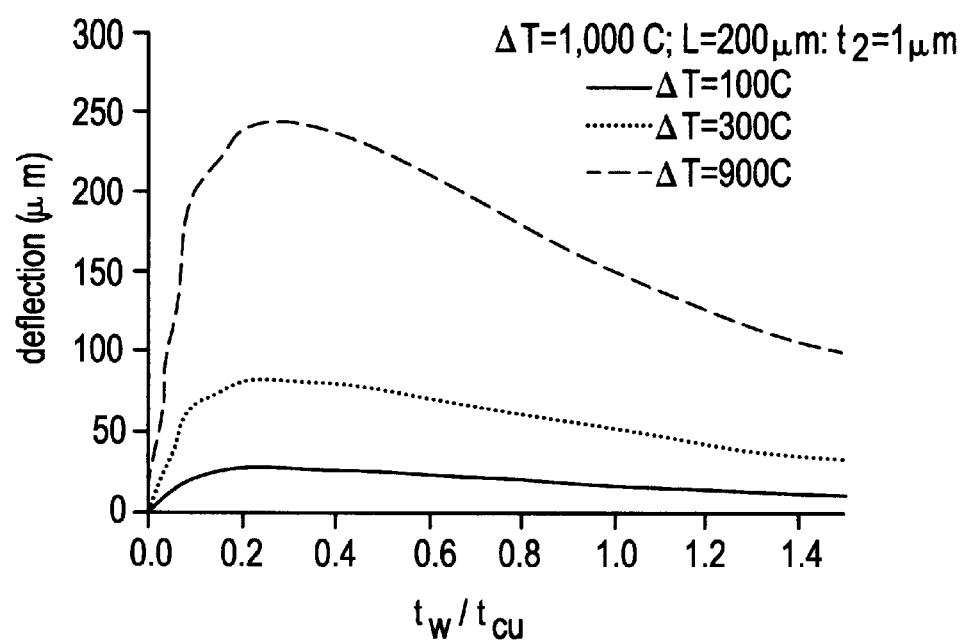
FIG. 15 is a graphically representation of the calculated deflection of a microspring according to the present invention at three different temperatures.

FIG. 15 shows the calculated deflection at three different temperatures, yielding an optimum ratio of thickness of W over thickness of Cu to be equal to 0.3.

Figure 16:
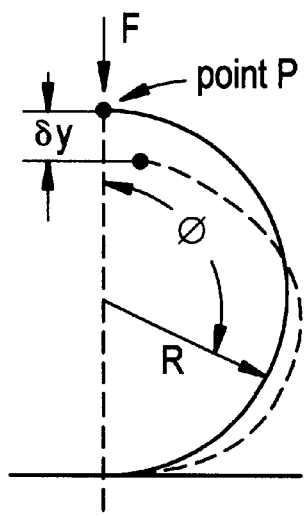
FIG. 16 schematically illustrates the deflection response to an applied force on a microspring element according to the present invention.

FIG. 16 shows the response to an applied force of a single spring element model of a microspring according to the present invention.

The mechanical properties required of each coiled microprobe or microspring or microcoil include a high degree of curvature and sufficient elasticity and stiffness ("springiness") in order to make ohmic contact. During use, elastic deformation with little or no plastic deformation is essential in applications requiring repeated use of microsprings such as with probe cards or may be used with devices intended to make temporary contact. Plastic deformation would be permissible for devices intended for permanent connections.

Thus, a microspring according to the present invention must be created with the mechanical properties needed for making ohmic contact with a metal surface. Some compliance is needed, and the stress created in each microspring during the application of the force needed for making ohmic contact cannot exceed the elastic limit for cases where temporary contact is to be made, and cannot exceed the fracture stress for the microspring for cases where permanent contact is to be made. These mechanical properties may be controlled by the choice of material and material dimensions.

An estimate of the mechanical response of a microspring to the applied force may be made by using several simplifying assumptions. For example, if the microspring were made from a rectangular slab of material of width w and thickness d in the shape of a half-circle, as shown in FIG. 9, wherein the lower end or proximal end is fixed, then the vertical (for example, downward) displacement $\delta_y$ in response to a vertical force at point P on the top of the half-circle is found by integrating the following equation:

$$\delta_y = \int_0^s \frac{Mz}{EI} ds \quad (1)$$

where:
R=radius of spring.
z=R(1−cos φ),
ds=Rdφ,
E=Young's modulus,
I=moment of inertia=$\frac{1}{12}$ ($wd^3$),
M=moment=FR sin φ
which upon substitution into Equation (1) becomes:

$$\delta_y = \frac{FR^3}{EI} \int_0^\pi \sin\phi(1-\cos\phi)d\phi \quad (2)$$

which results in:

$$\delta_y = \frac{2FR^3}{EI}. \quad (3)$$

By way of example, if microsprings are made of a copper alloy slab with w=50 μm, d=2 μm, and E=1.1×$10^{11}$ N/$m^2$, and assuming an applied force of 200 μN, then microsprings with radii R=25 μm and 100 μm have displacements $\delta_y$ of 1.6 μm and 118 μm, respectively. Cantilever-type structures are precursors for forming microsprings, and these cantilevers may be designed as having lengths ranging from, by way of example, and not by limitation, 100 to 600 μm and as having dimensions such as those presented in Table 1, wherein the displacement $\delta_y$ corresponding to this range of widths has been calculated using the above Equation (2) wherein it was assumed that the force F=400 μN, R=50 μm, E=1.1×10$^{11}$ N/m$^2$. The film thickness d is calculated for the simple case of a cantilever consisting of a single material.

TABLE 1

Calculation and Displacement for Various Conditions

| d(μm) | w(μm) | $\delta_y$(μm)* |
|---|---|---|
| 4 | 60 | 4.0 |
| 4 | 20 | 8.5 |
| 2 | 60 | 33 |
| 2 | 20 | 68 |

*Calculations assume that F = 400 μN, R = 50 μm, E = 1.1 × 10$^{11}$ N/m$^2$.

If the half-circle spring were replaced by a full circle spring, the displacement would be roughly halved. Further reduction in the displacement may occur when the surfaces of adjacent coils or volutions in the spiral-shaped spring begin to touch each other as the microspring becomes compressed under load. Smaller displacements with increasing loads aids in keeping the strain within elastic limits.

When forming microsprings, an increased amount of curvature is highly preferred at increasing distances toward the distal end of the lever.

In order to form the microsprings with a suitable amount of distal end curvature, an integral heater may be applied within each microcantilever in one embodiment of the present invention. Heat sinking causes the lever to be hotter at the free end, thereby giving the desired curvature results. The integral heater may be in the form of a thin film resistor imbedded within the cantilever structure and of such dimensions that it may easily be heated through an applied current. The heater element is formed during fabrication by standard wafer-stage processing steps. A typical applied power sufficient to cause coil formation is in the range of 50 μW.

The desired amount of distal end curvature may instead be achieved with global heating without an integral heater within each layer. Thus, in another embodiment of the present invention, the coil configuration can be created by global heating of the entire wafer, after releasing of the cantilevers by dissolution of the sacrificial layer, in a furnace, such that individual heating of each cantilever is not necessary. The global heating should raise the temperature of the coils to a temperature sufficient to form the coil and to insure plastic deformation.

Figure 17:
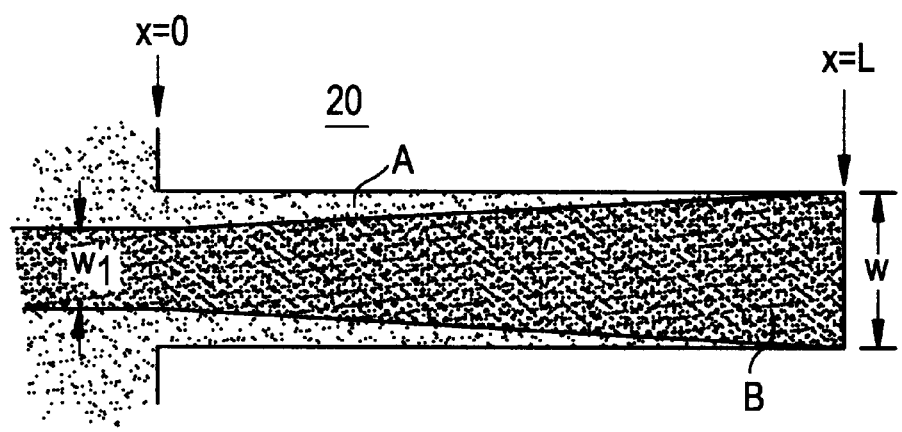
FIG. 17 is a side elevational cut-away representation of another embodiment of the present invention showing a bimorph structure suitable for global heating.

FIG. 17 shows an embodiment of a bimorph structure 20 used for the "global heating" structure where one layer has a continuously changing depth or width, thereby giving rise to a continuous change in bending stress at a given temperature. The cantilever 20 is illustrated in FIG. 17 with the high thermal coefficient bimorph component (layer A) of uniform width w and the other component (layer B) varying in width from $w_1$ to w. This configuration causes the cantilever to bend "upwards" when heated. The proximal end of the cantilever is fixed to the main body of the device x=0 with the width w. Layer B starts with the width $w_1$, which is less than the width w, up to the width w at x=L, the distal end of the cantilever. In other words, the width of layer B is a function of the distance x from the fixed end to the free distal end. Thus, in a particular embodiment, the width of the layer varies linearly and can be described by the equation:

$$w(x)=ax+b. \quad (4)$$

By way of example, layer A may be made from copper or a copper alloy, while layer B may be made from tungsten. The length may be on the order of 100 to 400 microns and $w_2$ may be between 20 to 30 microns. Because tungsten has a lower coefficient of thermal expansion, the stress increases with distance along the cantilever, giving rise to a nonuniform bending of the cantilever into the preferred coil shape upon heating.

In general, the thickness ratio of the two components of the bimorph are preferably optimized to provide the tightest spring for a given forming temperature. FIG. 15 shows the effect of variations in thickness of components of bimorph on tip deflection at three different temperatures, wherein a cantilever length of 200 μm and a copper thickness of 1 μm were assumed. The deflection as a function of the ration of thicknesses may be described by the following equation:

$$\delta = \frac{3\Delta\alpha \cdot \Delta T\left(1+\frac{d_1}{d_2}\right)L^2}{d_2\left\{\left(\frac{w_1 E_1}{w_2 E_2}\right)\left(\frac{d_1}{d_2}\right)^3 + \frac{w_2 E_2 d_2}{w_1 E_1 d_1} + 2\left[2\left(\frac{d_1}{d_2}\right)^2 + 3\left(\frac{d_1}{d_2}\right)+2\right]\right\}} \quad (5)$$

Figure 18:
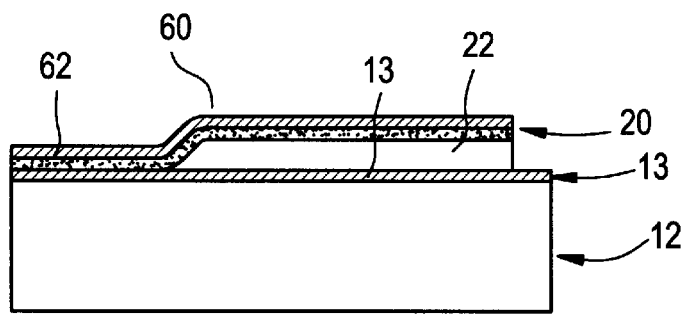
FIGS. 18-20 illustrate a series of processing steps which may be used to produce the microspring or microcoil structure according to the present invention.
Figure 19:
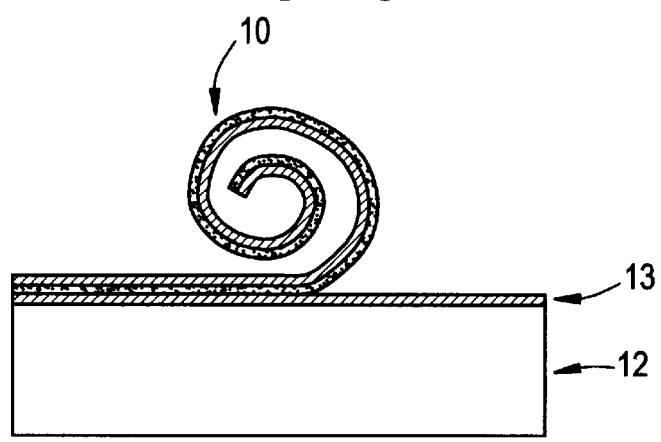
Figure 20:
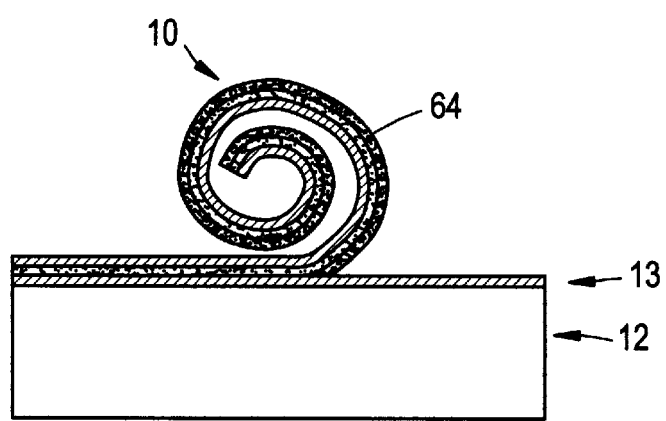

FIGS. 18–20 illustrate a series of generic processing steps which may be used to produce the basic microspring or microcoil structure 10. First, the basic structure must be formed. This structure consists of a thin insulating film 13 over a silicon wafer 12, and cantilevers 20 separated from the insulating film 13 by a "sacrificial layer" 22 that can later be easily removed as shown in FIG. 18. The bimorph cantilever 20 is made of a low thermal expansion coefficient layer 60 disposed over a high thermal expansion coefficient layer 62. After removing the sacrificial layer 22 and heating the cantilevers 20, the cantilevers are curled into microcoils or microsprings 10 as shown in FIG. 19. Finally, as shown in FIG. 20, the microsprings 10 are electroplated with gold or platinum 64 or other metal or other electrically conductive material in order to make it easier to obtain ohmic contact. The gold may or may not plate onto the low thermal expansion coefficient (α) layer 60 depending on its nature (e.g. metal or insulator) but this typically has very little impact on subsequent operation of the device. It should be understood that the series of processing steps diagrammatically illustrated in FIGS. 18–20 are illustrative only, and that a different series of steps may also be used to produce the final structure.

In one particular embodiment of the present invention, a micromachined element or microprobe or microspring is produced according to the following steps: (a) start with a substrate, such as silicon, Si; (b) deposit a thin insulating layer, such as silicon dioxide; (c) deposit a sacrificial layer, such as polyimide; (d) pattern the polyimide using photolithography, so that strips of polyimide left after patterning define, at least roughly, the outline of the cantilever (s); (e) deposit a thin metal "ground plane" over the entire wafer to later serve as an electrode for electroplating; (f) define the metal regions photolithographically with resist thicker than the thickness of the plated metal to be used; (g) electrodeposit the high thermal expansion metal such as copper; (h) deposit a thinner layer of the low thermal expansion material by sputtering or other method; (i) remove the resist, such that the second, i.e. low thermal expansion, material that is deposited over the resist is lifted off with the resist leaving the remainder of that film in contact with the underlying high-α material; j) remove the ground plane where it is exposed and the sacrificial layer; (k) form the microsprings by heating; and (l) electroplate a material such as gold or palladium for improved contact. Heating is performed either globally in a furnace (requiring the low-α layer to have a shape as described, for example, in FIG. 17) or by supplying heating power to built-in resistive heaters.

Thus, the present invention provides a microprobe which is the basis of an array for contacting a very large number of contact pads on chips or MEMS. The present invention provides for compliant contacts which are able to sustain relatively high contact forces.

An array of the microprobes according to the present invention may be incorporated into a single wafer probe card. The wafer probe card may be suitable for wafer probing/testing of chips on wafer/chip packages and multi-chip modules.

Thus, in one embodiment, the present invention relates to a probe card for testing dies and chips and multi-chip assemblies or multi-chip modules.

In another embodiment, the present invention relates to a "backplane" for supplying (permanent or temporary) interconnections in complicated chips where the chips are too complex to support the necessary interconnects all within the chip. There is a growing need for such a backplane in these applications.

In yet another embodiment, the present invention relates to a "backplane" supplying (permanent or temporary) interconnections to the components of multi-chip modules or assemblies arranged in planar fashion. These components can be dies representing different technologies, e.g., IC technology and MEMS technology (for instance, memory chips and sensor chips and driver chips in the same module). One of the advantages to this embodiment of the present invention is that if a component die doesn't function properly, it can be easily removed and replaced without breaking any bonded (e.g. soldered) connections.

In still another embodiment the present invention relates to an "interconnect plane" supplying (permanent or temporary) interconnections to multi-chip modules or assemblies arranged in vertical fashion. In this case the interconnect plane is a wafer with microsprings on both surfaces. The interconnections through vias in the wafer to the microsprings on both surfaces and the arrangement of microsprings on both surfaces may be all arranged to meet the interconnection requirements of the adjacent vertically-stacked modules.

The above embodiments typically comprise devices which have interconnections and IC components (if desired) on one or the other or on both surfaces.

Furthermore, the wafer probe card in accordance with the present invention is thus conformable to curved surfaces or to contacts of varying height.

In another aspect, the microcoil according to the present invention may be used for generating an electromagnetic field. The coil can be devised to generate a magnetic field in a direction parallel to the nominal surface by passing current unidirectionally (clockwise or counterclockwise) through the coil. An electrical contact at both ends of the coil are required.

Figure 21:
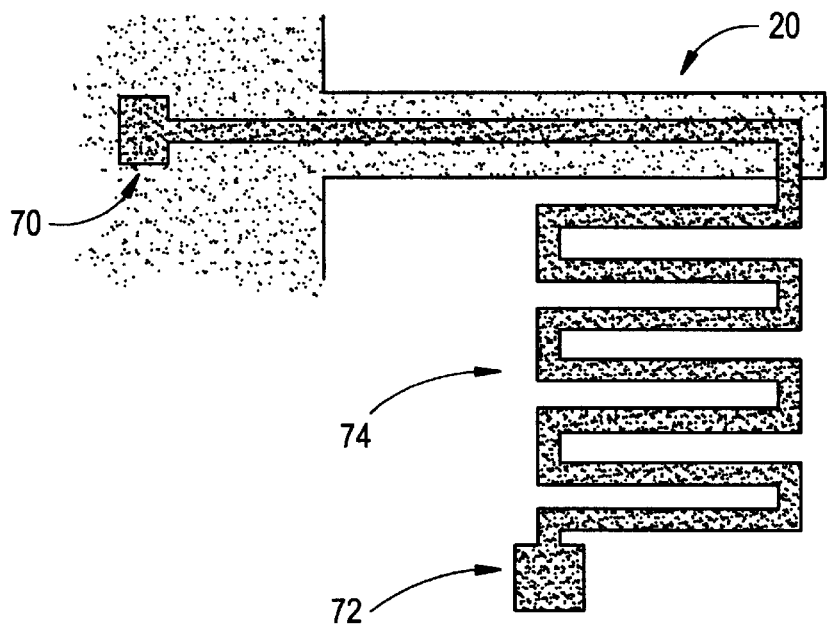
FIG. 21 is a side elevational cut-away view of a precursor to yet another embodiment of the present invention which is capable of producing an electromagnetic field.

A schematic representation of the means of electrically connecting the distal end of the cantilever 20 or microspring is shown in FIG. 21. FIG. 21 does not show the essentials of the bimorph structure, nor the heater which provides heat to initially form the coil, if furnace heating is not utilized. A first pad 70 and a second pad 72 are not placed over a sacrificial layer, but are fixed. The lever 20 is released by removing the sacrificial layer. The electrical connection line 74 is over a sacrificial layer. When the sacrificial layer is removed, the line 74 is freed in space. After actuation and formation of the coil 10, electrical contact is achieved for both ends, as shown by the example in FIG. 22. Thus, if the coil 10 consists of five turns, then the freed electrical line 74 will contain five twists.

Thus, the present invention comprises a new contact technology which may take the form of MEMS-fabricated microsprings or microcoils. The present invention has the potential for making low cost, compliant electrical contacts and interconnects to pads on discrete devices and on assemblies of chips and MEMS devices. The present invention can be applied to situations requiring temporary contact such as probe cards for wafer-stage testing of device chips, as well as to situations requiring temporary or permanent connections such as interconnects within a chip, among chips or dies in a multi-chip module (MCM), or among modules in a larger assembly. Therefore, the present invention offers significant advantages over existing contact technologies.

In at least one embodiment, the present invention is based on forming arrays of microsprings for making compliant and ohmic contact to contact surfaces. For example, microsprings may be made on the surface of a silicon wafer. The microspring may afford both permanent and temporary contacts. Contacts and interconnects made with the present invention can be applied to increasingly complex device chips and hybrid assemblies with increasingly smaller device dimensions and higher I/O pad density, including both parameter and interior pads. Such connections can also be made with pads or solder bumps on chips or on various components comprising MCMs. Because a silicon wafer may be used as a substrate for the present invention, passive components (e.g. capacitors and resistors), active IC devices, and transmission lines can be made on an opposite surface, and can be connected to microsprings with vias through the wafer, such as for applications to high-frequency and other critical devices.

An important advantage to spring-type contacts provided by the present invention lies in the compliance offered by spring elements to accommodate both variations in height of arrays of contacting surfaces, and thermal motion of components made of different materials.

The present invention can provide a minimum pad pitch of less than approximately 3 mils. The capacity for maximum number of I/Os is high with the present invention.

A probe card constructed according to the present invention is also able to contact pads at varying elevations, i.e. the probe card is conformable to pads of varying height. Furthermore, IC components and high-frequency transmission lines may be integrated on the probe card of the present invention, especially if a silicon substrate is used. The present invention is also able to contact large die and can contact both area and perimeter arrays. The present invention may also access components of multi-chip modules.

Moreover, membrane technology is not required to fabricate the present invention, although membrane technology may be used in certain embodiments.

On the other hand, a known membrane probe card would not be able to contact pads at varying elevations, as the pads to be contacted must be planar. While the membrane probe card may be able to contact large die, membrane bowing requires a large footprint. Moreover, the membrane probe card requires membrane technology for fabrication.

Thus, the present invention overcomes the limitations of known devices by providing the capability to make reliable electrical contact to contact pads on larger chips and on MCM packages and assemblies.

Furthermore, the application of the present invention is not limited to wafer probe cards or wafer-stage testing. For example, the present invention provides a means for rapidly supplying temporary or permanent contacts with chips or with components of MCMs or connections between modules. By way of further example, the present invention may be utilized as providing interconnects for a complex chip. Interconnections within a chip are becoming quite complex. A separate surface containing various interconnections may be provided to supply or supplement these interconnections. For example, the other surface may be disposed on a second wafer that contains some or all of the necessary connections, including both passive and active devices as needed, e.g. transistor pre-amps, or impedance-matched transmission lines for GHz frequencies. Contact would then made to the chip with microsprings on the opposite (second) surface of this second wafer, and connections between microsprings and the interconnects (on the first surface) are made through vias.

The present invention may also be employed in interconnects for multi-chip modules/assemblies. Thus, the present invention may be advantageously utilized in situations where different manufactures supply device components of different thicknesses, resulting in contact pads on different components which are not co-planar. In other situations, different manufacturers may use different materials for their packages and/or contact pads. Variations in temperature, either during packaging or during use, can cause variations in dimensions including "effective pad height" due to differences in thermal expansion of the various materials. The microsprings of the present invention can accommodate any of these scenarios because of their built-in compliancy.

The present invention may also be used in conjunction with wafer probe cards or interconnects for devices or chips or components having curved surfaces.

The cantilever microspring-precursor design of the present invention can be such as to permit use of global heating, such as in a furnace, rather than individual heating of each lever with integral heaters. FIG. 17 shows one such design where the stress and therefore the curvature (after coil formation) increases along the lever in response to a given temperature. Alternatively, the low-α component can be made of uniform width and the high-α component made of varying width to achieve the same goal. It is noted that the variation in width is not required to be linear with distance along the cantilever.

Figure 22:
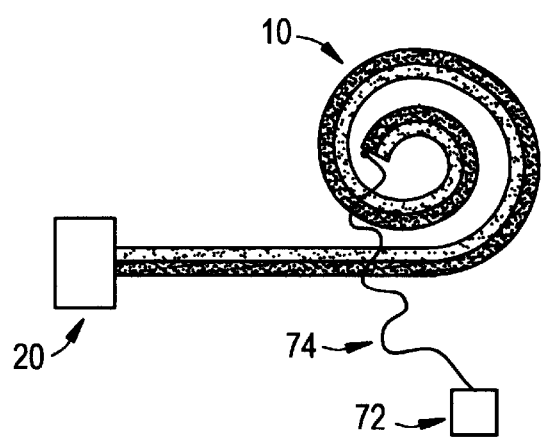
FIG. 22 is a perspective view of the microcoil formed after heating the precursor of FIG. 21.

Another application of the present invention involves forming microcoils for generating magnetic fields with the field axis generally parallel to the substrate. FIG. 21 illustrates a design which allows an electric current to flow through the coil (after coil formation) in order to generate a magnetic field. FIG. 22 shows the coil of FIG. 21 after final formation.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing Figures shall be interpreted as illustrative only and not in a limiting sense.

It is also to be understood that the following Claims are intended to cover all of the generic and specific features of the invention herein described and all statements of the scope of the invention which, as a matter of language, might be said to fall therebetween.

What is claimed is:

1. A micromachined element mounted to a substrate, said micromachined element comprising:

a cantilever having a proximal portion attached to said substrate and a free distal end, wherein said cantilever, upon being heated, is capable of bending away from the substrate and at least partially coiling upon itself to define an irreversibly coiled distal portion having at least one full volute, wherein at least part of said coiled portion is electrically conductive, whereby electrification of said conductive part of said coiled portion generated an electromagnetic field.

2. A micromachined element mounted to a substrate, said micromachined element comprising:

a cantilever having:
 a proximal portion attached to said substrate; and
 a coilable distal portion terminating in a free distal end;
wherein said coilable distal portion, upon being heated, is capable of bending away from the substrate and at least partially coiling upon itself to permanently form a coiled portion having at least one full volute, wherein at least part of said coiled portion is electrically conductive, whereby electrification of said conductive part of said coiled portion generated an electromagnetic field.

3. The micromachined element according to claim 2 wherein heat is applied globally to said cantilever to form said coiled portion.

4. The micromachined element according to claim 2 wherein heat is resistively generated within said cantilever to form said coiled portion.

5. The micromachined element according to claim 2 wherein said free distal end follows an inward spiral path when heat is supplied to said cantilever.

6. The micromachined element according to claim 2 wherein, upon being heated, the degree of bending in said cantilever increases in a distal direction.

7. The micromachined element according to claim 2 wherein the radius of curvature of said coiled portion decreases distally along said cantilever.

8. The micromachined element according to claim 2 wherein said free distal end is permanently suspended over said substrate and is separated therefrom by a gap.

9. The micromachined element according to claim 2 wherein at least part of said cantilever is electrically conductive.

10. The micromachined element according to either of claims 1 or 2 wherein said micromachined element is capable of generating a magnetic field having an axis generally parallel to the surface of said substrate from which said element extends.

11. The micromachined element according to claim 2 wherein said cantilever is electrically insulated from said substrate.

12. The micromachined element according to claim 2 wherein said coiled portion is capable of being resiliently compressed.

13. The micromachined element according to claim 2 wherein said cantilever is substantially comprised of a bimorph structure.

14. The micromachined element according to claim 13 wherein said cantilever further comprises:
   a first conducting layer having at least one portion disposed proximate said substrate; and
   a second layer disposed over said inner first conducting layer.

15. The micromachined element according to claim 14 wherein said cantilever further comprises:
   a conductive lead attached to said first conducting layer.

16. The micromachined element according to claim 14 wherein said cantilever further comprises:
   a first conductive lead attached to said first conducting layer proximate said proximal portion; and
   a second conductive lead attached to said first conducting layer proximate said free distal end;
   whereby said coiled portion is capable of being electrified, thereby generating a magnetic field.

17. The micromachined element according to claim 14 wherein said first layer has a greater coefficient of thermal expansion than said second layer.

18. The micromachined element according to claim 14 wherein said first layer is comprised of a metal.

19. The micromachined element according to claim 2 wherein said cantilever further comprises at least one outer volute and at least part of an inner volute.

20. The micromachined element according to claim 19 wherein said outer volute is spaced apart from said inner volute when said micromachined element is uncompressed.

21. The micromachined element according to claim 20 wherein at least two adjacent said volutes are capable of resiliently contacting one another when said micromachined element is compressively loaded.

22. The micromachined element according to claim 19 wherein said volutes are spaced apart from each other when said element is uncompressed.

23. The micromachined element according to claim 19 wherein said outer volute compresses before said inner volute when said micromachined element is compressively loaded.

24. The micromachined element according to claim 2 wherein, upon being heated, said cantilever further comprises a plurality of volutes.

* * * * *